United States Patent
Miyata

(10) Patent No.: US 9,639,656 B2
(45) Date of Patent: May 2, 2017

(54) MACHINING SIMULATION DEVICE AND METHOD

(75) Inventor: Akira Miyata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 654 days.

(21) Appl. No.: 14/123,653

(22) PCT Filed: Jun. 20, 2012

(86) PCT No.: PCT/JP2012/065757
§ 371 (c)(1),
(2), (4) Date: Dec. 3, 2013

(87) PCT Pub. No.: WO2013/002097
PCT Pub. Date: Jan. 3, 2013

(65) Prior Publication Data
US 2014/0114458 A1    Apr. 24, 2014

(30) Foreign Application Priority Data
Jun. 29, 2011 (JP) .................................. 2011-144680

(51) Int. Cl.
*G06F 17/50* (2006.01)
*G05B 19/4069* (2006.01)
(52) U.S. Cl.
CPC ..... *G06F 17/5086* (2013.01); *G05B 19/4069* (2013.01); *G05B 2219/35349* (2013.01)
(58) Field of Classification Search
CPC combination set(s) only.
See application file for complete search history.

(56) References Cited

U.S. PATENT DOCUMENTS 6,751,523 B2    6/2004  Nakamura

FOREIGN PATENT DOCUMENTS

JP    2001 142515    5/2001
JP       4 329248    6/2009
(Continued)

OTHER PUBLICATIONS

H. El-Mounayri et al., "General Geometric Modelling Approach for Machining Process Simulation", The International Journal of Advanced Manufacturing Technology 1997.*
(Continued)

*Primary Examiner* — Carlos Ortiz Rodriguez
(74) *Attorney, Agent, or Firm* — Oblon, McClelland, Maier & Neustadt, L.L.P.

(57) ABSTRACT

A machining simulation device includes a local-region setting unit that sets a local region for a workpiece, an offset-deformation processing unit that offsets and deforms a shape of a part of a whole three-dimensional shape model of the workpiece, for which the local region is set, and generates a local three-dimensional shape model of the workpiece, a local tool-movement-data output unit that outputs local tool movement data from whole tool movement data based on a tool model and movement path data of a tool, a local cutting-deformation processing unit that cuts and deforms the local three-dimensional shape model of a workpiece based on the local tool movement data, and a display superimposing unit that superimposes the cut and deformed local three-dimensional shape model of the workpiece on the whole three-dimensional shape model of the workpiece, and displays the superimposed result.

5 Claims, 4 Drawing Sheets

(56) References Cited

FOREIGN PATENT DOCUMENTS

JP        2009 265943      11/2009
JP        2011 85978       4/2011

OTHER PUBLICATIONS

International Search Report Issued Aug. 21, 2012 in PCT/JP12/065757 Filed Jun. 20, 2012.

* cited by examiner

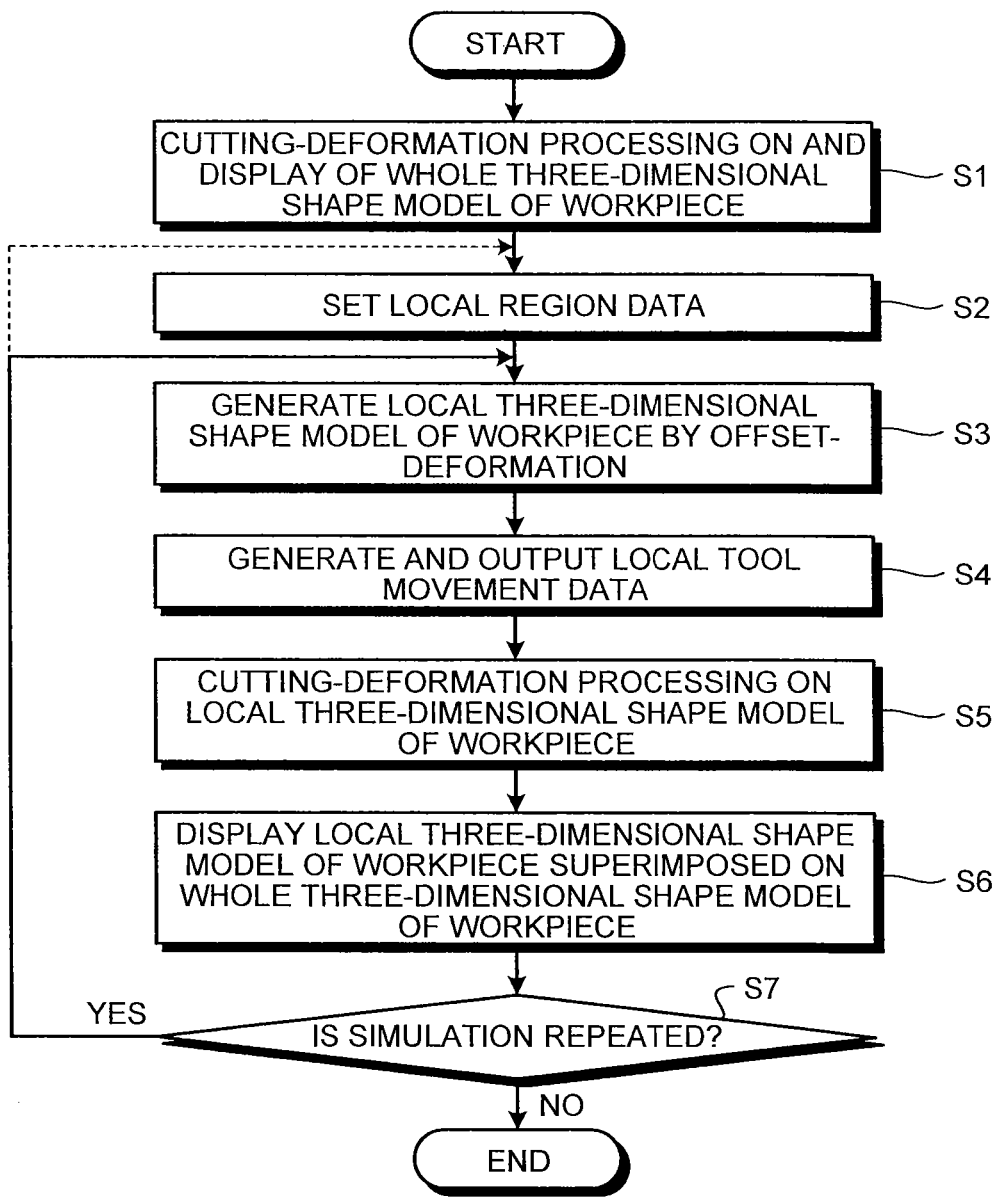

MACHINING SIMULATION DEVICE AND METHOD

FIELD

The present invention relates to cutting work using a numerical control (NC) machine tool, and to machining simulation device and method for simulating cutting work on a workpiece (material to be processed) represented by a three-dimensional shape model using a computer by cutting and deforming the shape of the workpiece based on a tool model and its movement path, and by graphically displaying the resulting shape.

BACKGROUND

A machining simulation has been widely used in performing cutting work using an NC machine tool, in order to examine whether a desired shape can be formed correctly with an NC program that has been created and prepared. However, in a case where a problem with the machining is found after executing the machining simulation, the machining simulation often needs to be executed repeatedly in order to analyze the cause of the problem and/or make a solution to the problem.

In cutting work, a workpiece originates from a state of raw material, and undergoes successive cutting done by individual movements of a tool, which leads to a shape of a final result of the cutting work. Therefore, it is difficult in a machining simulation that simulates the cutting work to advance the simulation while skipping a midway process thereof. It is common to re-execute the simulation from the beginning of the cutting work each time the simulation is repeated.

Cutting-deformation processing on a three-dimensional shape model of a workpiece, which is performed in a computer during a machining simulation, requires a long calculation time that is not negligible. Therefore, in a case where a found problematic point appears near the end of the machining, for example, a considerable amount of a waiting time is required until the problematic point can be checked, and therefore there has been a problem that examination work cannot be performed efficiently.

An invention setting solving this problem as its object is disclosed in Patent Literature 1. According to the invention disclosed in Patent Literature 1, in a machining composed of a plurality of steps, after a stimulation result (pixel data) of a final state at each of the steps is saved, the simulation result at a step immediately before the step at which a simulation is restarted is read, and the simulation is executed from that point. Therefore, examination work can be performed more efficiently as compared to the case where a machining simulation is executed from the beginning of the machining.

CITATION LIST

Patent Literature

Patent Literature 1: Japanese Patent No. 4329248

SUMMARY

Technical Problem

In the technique disclosed in Patent Literature 1, midway results of a machining simulation are saved at important points in time during the machining, such as at ends of the steps, and the machining simulation is restarted with reading the result. In such a technique, a storage area for saving the midway results of the machining simulation is required correspondingly to the number of times of saving (for example, the number of steps).

Representing the shape of a workpiece by a three-dimensional shape model is a mainstream method of a machining simulation that has been widely used recently. Therefore, the size of a memory allocated to a storage area is large and not negligible, and a high-performance computer is required. In contrast, when the number of times of saving a midway result of a machining simulation is reduced, a dilemma occurs in which a long waiting time is required until machining at a problematic point can be checked.

The present invention has been achieved in view of the above-mentioned circumstances, and its object is to provide simulation device and method that can obtain a result in a shorter time and can perform examination work more efficiently in a machining simulation that is repeatedly executed, as compared to re-executing the simulation from the beginning of the machining each time of the execution.

Solution to Problem

In order to solve the above-mentioned problems and achieve the object, the present invention provides a machining simulation device that simulates cutting work on a workpiece by cutting and deforming a three-dimensional shape model of the workpiece based on a tool model and movement path data representing a movement path of a tool, and displaying the cut and deformed three-dimensional shape model of the workpiece, the device comprising: a holding unit that holds therein the three-dimensional shape model of the workpiece after the cutting work; a unit that sets a local region for the workpiece; a unit that offsets and deforms a shape of a part of the three-dimensional shape model of the workpiece after the cutting work, for which the local region is set, by a predetermined thickness in an outward direction, and generates a local three-dimensional shape model of the workpiece; a tool-movement-data generation unit that generates whole tool movement data based on the tool model and the movement path data of the tool; a local tool-movement-data output unit that outputs local tool movement data that are tool movement data obtained when the tool passes through the local region from the whole tool movement data; a local cutting-deformation processing unit that cuts and deforms the local three-dimensional shape model of the workpiece based on the local tool movement data; and a unit that displays a superimposed three-dimensional shape model obtained by superimposing the local three-dimensional shape model of the workpiece, which has been cut and deformed by the local cutting-deformation processing unit, on the three-dimensional shape model of the workpiece obtained after the cutting work, which has been held in the holding unit.

Advantageous Effects of Invention

According to the present invention, the vicinity of a problematic point in respect of the machining is beforehand designated as a local region, and a local machining simulation is executed beginning with a local three-dimensional shape of a workpiece obtained by offsetting and deforming the shape within the local region by a thickness corresponding to a tool diameter or a cutting amount, and using only a tool model related to cutting within the local region and its tool path. Therefore, it is possible to check the shape of the machined result at the problematic point in a shorter time as compared to re-executing the machining simulation from the beginning of the machining, and works such as analyzing a problem in respect of the machining and taking measures against the problem while repeating the machining simulation can be performed more efficiently.

BRIEF DESCRIPTION OF DRAWINGS

FIG. 2 is a flowchart of a machining simulation using a machining simulation device 1.

DESCRIPTION OF EMBODIMENTS

Embodiments of machining simulation device and method according to the present invention will be described below in detail with reference to the drawings. The present invention is not limited to these embodiments.

First Embodiment

Figure 1:
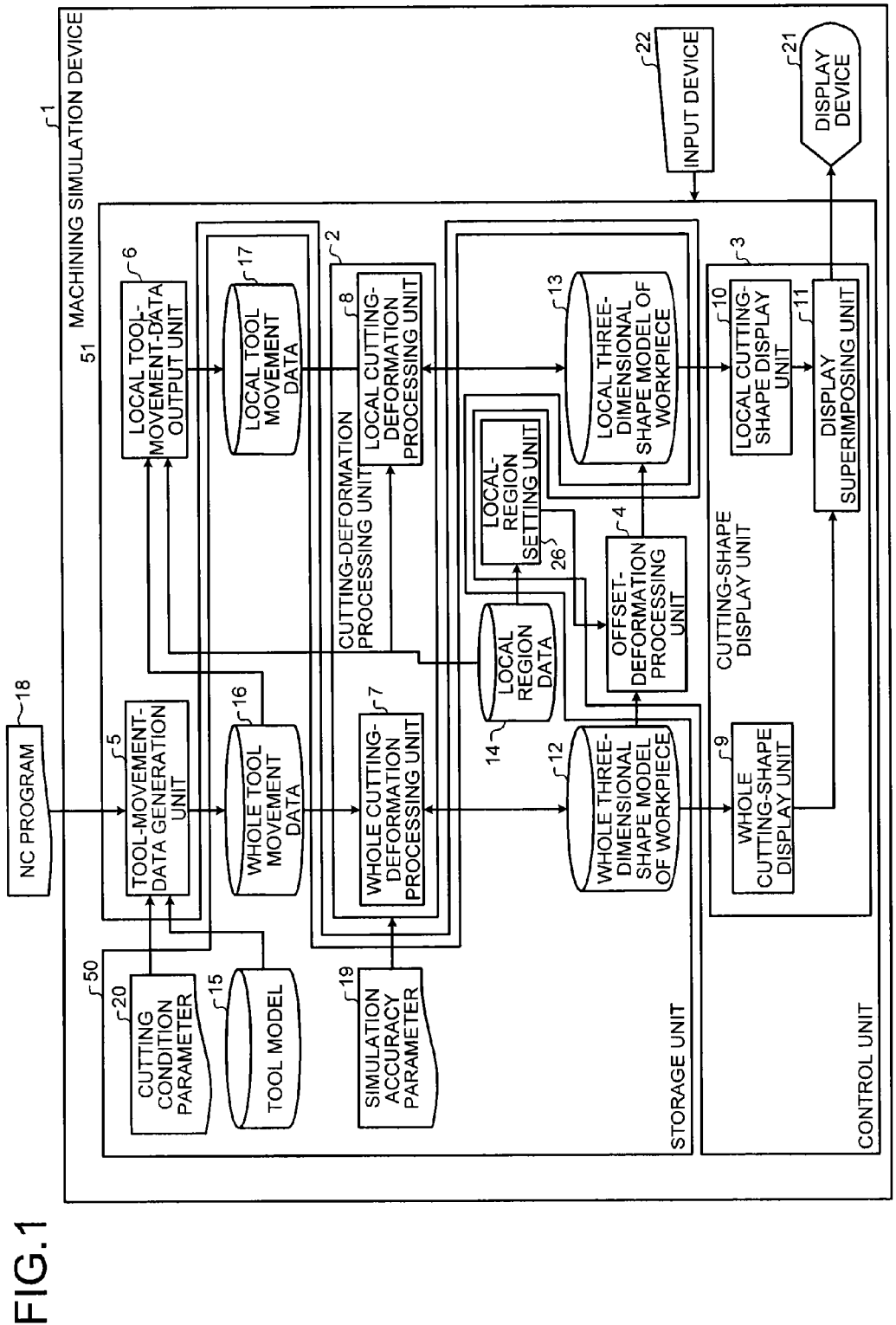
FIG. 1 is a diagram showing a configuration of a machining simulation device according to a first embodiment of the present invention.

FIG. 1 is a diagram showing a configuration of a machining simulation device according to a first embodiment of the present invention. A machining simulation device 1 includes: a storage unit 50 that stores therein a three-dimensional shape model 12 of a whole of a workpiece (material to be machined), a local three-dimensional shape model 13 of a workpiece, local region data 14 and a tool model 15 and a control unit 51 that includes functional units such as a cutting-deformation processing unit 2, a cutting-shape display unit 3, an offset-deformation processing unit 4, a tool-movement-data generation unit 5 and a local tool-movement-data output unit 6. The machining simulation device 1 simulates cutting work on a workpiece by cutting and deforming a three-dimensional shape model of the workpiece based on the tool model 15 and movement path data indicating a tool movement path, and displaying the cut and deformed three-dimensional shape model of the workpiece. The control unit 51 is a processing device that includes a CPU, a RAM, and the like. The functional units in the control unit 51 are realized on the CPU by software processing. The storage unit 50 is a storage device that holds therein data in a nonvolatile manner.

Further, there are whole tool movement data 16 and local tool movement data 17 as data that are temporarily generated and held during execution of the simulation.

In the present embodiment, the cutting-deformation processing unit 2 further includes a whole cutting-deformation processing unit 7 that performs cutting-deformation processing on the whole three-dimensional shape model 12 of a workpiece, and a local cutting-deformation processing unit 8 that performs cutting-deformation processing on the local three-dimensional shape model 13 of a workpiece.

The whole cutting-deformation processing unit 7 and the local cutting-deformation processing unit 8 are the same in processing contents, except for a difference in a three-dimensional shape model of a processing target, and for a difference in tool movement data to be inputted for the cutting-deformation processing. Therefore, they may also be configured to use one and the same cutting-deformation processing unit to switch the three-dimensional shape model of the processing target and the input tool movement data in accordance with a mode.

In the present embodiment, the cutting-shape display unit 3 includes a whole cutting-shape display unit 9 that displays the whole three-dimensional shape model 12 of a workpiece, a local cutting-shape display unit 10 that displays the local three-dimensional shape model 13 of a workpiece, and a display superimposing unit 11 that superimposes a local cutting-shape display result on the whole cutting shape display result to display the superimposition result as a superimposed three-dimensional shape model.

The whole cutting-shape display unit 9 and the local cutting-shape display unit 10 are the same in processing contents, except for a difference in a three-dimensional shape model of a display target. Therefore, they may also be reconfigured to use one and the same cutting-shape display unit to switch the three-dimensional shape model of the display target in accordance with a mode.

The machining simulation device 1 has a simulation accuracy parameter 19 and a cutting condition parameter 20 in the storage unit 50. The simulation accuracy parameter 19 and the cutting condition parameter 20 are referred by the cutting-deformation processing unit 2 and the tool-movement-data generation unit 5, respectively, as needed.

Other than those described above, the machining simulation device 1 in its entirety includes a display device 21 to which the shape of a workpiece is outputted to be displayed, and a keyboard and a mouse that serve as an input device 22 for a user to operate the machining simulation device 1, to provide an instruction regarding the line-of-sight direction for the display, and to do something like that. The display device 21 and the input device 22 may be provided outside of the machining simulation device 1.

Further, an NC program 18 is provided as external data of the machining simulation device 1, and is an input source for processing in which the tool-movement-data generation unit 5 generates tool movement data.

The local region data 14 are of a region of interest that particularly requires check of a result by executing a machining simulation repeatedly, and is stored in the storage unit 50 by an operator through the input device 22. A rectangular region represented by its height, width, depth and position or a spherical region represented by its center and radius can be used as a specific example for the local region data 14. A local-region setting unit 26 sets a local region for a workpiece as a region of interest based on the local region data 14.

The whole three-dimensional shape model 12 of a workpiece and the local three-dimensional shape model 13 of a workpiece are three-dimensional shape data that represents the momentary shape of the workpiece during execution of the machining simulation. The whole three-dimensional shape model 12 of a workpiece represents the whole shape of the workpiece. The local three-dimensional shape model 13 of a workpiece represents a partial shape of the workpiece which is included within the range of the local region data 14. A boundary representation model or a patch model that represents a surface of a target shape using a set of triangular or polygonal planes can be used, or a voxel model that represents a volume of a target shape using a set of minute cubes or other discrete models similar to the voxel model can be used, as specific examples of the three-dimensional shape model.

Generally, from the view point of the simulation speed, these three-dimensional shape models adopt a mode of approximate representation under a given degree of representation accuracy in most cases. The degree of representation accuracy is controlled by the simulation accuracy parameter 19.

The tool model 15 stores and holds therein data describing information regarding the type of a tool to be used for machining, such as ball end mill, and regarding the tool shape such as tool diameter and tool length.

The whole tool movement data 16 and the local tool movement data 17 are each a combination of a tool shape and individual tool movement paths during execution of the machining simulation. The tool shape is represented by referring to the data stored and held in the tool model 15. The individual tool movement paths are represented by data describing information regarding the start and end points of tool movement, and regarding the curve type (such as straight or circular) of the path between the start and end points.

The tool-movement-data generation unit 5 analyzes the NC program 18 to obtain individual movement commands, and generates the whole tool movement data 16 in which the tool model 15 to be a target of the movement commands is combined with the tool movement path, based on the cutting condition parameter 20. As an example of the cutting condition parameter 20, a feed speed, an acceleration/deceleration coefficient or the like may be taken.

The local tool-movement-data output unit 6 uses the whole tool movement data 16 generated by the tool-movement-data generation unit 5 as an input thereto. When the tool model 15 passes through the range of the local region data 14, the local tool-movement-data output unit 6 outputs the tool movement data as the local tool movement data 17.

The cutting-deformation processing unit 2 uses tool movement data as an input thereto, and performs processing for cutting and deforming a three-dimensional shape model of a processing target based on the contents of the input tool movement data. Specifically, a common portion between a three-dimensional shape model of a workpiece and a sweep shape of a tool calculated based on a tool model and its movement path, is removed from a three-dimensional shape of the workpiece, thereby updating the three-dimensional shape model as a shape of the after-cutting workpiece.

In the present embodiment, the whole cutting-deformation processing unit 7 that is a component of the cutting-deformation processing unit 2 has the whole tool movement data 16 as an input thereto and sets the whole three-dimensional shape model 12 of a workpiece as a processing target, and the local cutting-deformation processing unit 8 has the local tool movement data 17 as an input thereto and sets the local three-dimensional shape model 13 of a workpiece as a processing target. Thereby, the units 7 and 8 perform deformation processing.

The offset-deformation processing unit 4 generates a three-dimensional shape model obtained by offsetting and deforming or increasing a thickness of a shape of a part of the whole three-dimensional shape model 12 of a workpiece, which is included within the range of the local region data 14, by a predetermined thickness in the outward direction of the shape, and sets the generated three-dimensional shape model as the local three-dimensional shape model 13 of a workpiece. Depending on the representation form of a three-dimensional shape model, offset-deformation processing is performed in conventionally-known methods or in other methods in which the shape with a schematically curved surface located at a distance of a given range from a surface of the before-deformation shape, is used as a substitute for an offset shape, because what is particularly problematic in respect of machining is a shape of the machining result at a point on which attention is focused, and exactness of the offset shape that is an initial state of simulation re-execution may be arbitrary.

The cutting-shape display unit 3 has a three-dimensional shape model of a workpiece as an input thereto, generates its projected image based on a designated line-of-sight direction and a display scale, and outputs the projected image to the display device 21.

In the present embodiment, the whole cutting-shape display unit 9 that is a component of the cutting-shape display unit 3 has the whole three-dimensional shape model 12 of a workpiece as an input thereto, and the local cutting-shape display unit 10 has the local three-dimensional shape model 13 of a workpiece as an input thereto, thereby generating their respective projected images and depth information, and the display superimposing unit 11 generates a final composite image (a superimposed three-dimensional shape model) in which the projected image of the local three-dimensional shape model 13 of a workpiece is given precedence in respect of a range of the local region data 14, and outputs the final composite image to the display device 21.

Next, description is given for a machining simulation method using the machining simulation device 1, and an operation of the processing units with reference to FIGS. 2 and 3A to 3D.

FIG. 2 is a flowchart of a machining simulation using the machining simulation device 1. FIGS. 3A to 3D are illustrations showing main processing contents in the machining simulation.

First of all, an operator executes a machining simulation on the whole three-dimensional shape model 12 of a workpiece from the beginning of the machining to the end or an arbitrary midway point in time thereof. This first machining simulation is a machining simulation that has been conventionally executed.

Figure 3A:
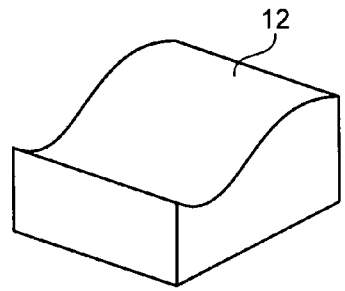
FIG. 3A is an illustration showing a main processing content in a machining simulation.

Inside the machining simulation device 1, the processing units that are the tool-movement-data generation unit 5, the whole cutting-deformation processing unit 7, and the whole cutting-shape display unit 9 operate, in order for cutting-deformation processing on and display of the whole three-dimensional shape model 12 of a workpiece to be performed (Step S1). The tool-movement-data generation unit 5 analyzes the NC program 18, and sequentially generates and outputs the whole tool movement data 16. The whole cutting-deformation processing unit 7 has the whole tool movement data 16 as an input thereto, and cuts and deforms the whole three-dimensional shape model 12 of a workpiece. FIG. 3A shows an example of the whole three-dimensional shape model 12 of a workpiece, which is obtained as a result of the first machining simulation. The whole cutting-shape display unit 9 graphically displays the whole three-dimensional shape model 12 of a workpiece on the display device 21 based on a predetermined line-of-sight direction and a display scale.

Figure 3B:
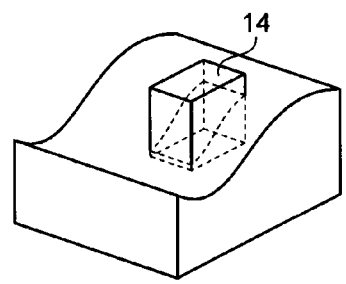
FIG. 3B is an illustration showing another main processing content in a machining simulation.
Figure 3C:
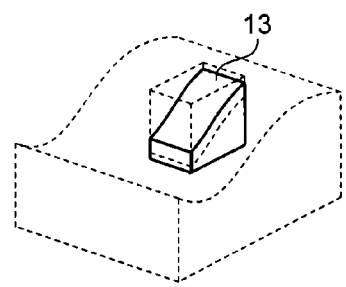
FIG. 3C is an illustration showing yet another main processing content in a machining simulation.

Next, while viewing the display of the result of the first machining simulation, an operator inputs, through the input device 22, the local region data 14 including the vicinity of a point (a region of interest) that is a problematic point in respect of the machining, where particularly the operator wants to check a result in detail by repeating a machining simulation. Inside the machining simulation device 1, the local-region setting unit 26 sets a local region based on the local region data 14 (Step S2), and the offset-deformation processing unit 4 operates (Step S3). The offset-deformation processing unit 4 offsets and deforms a shape of a part of the whole three-dimensional shape model 12 of a workpiece, which is included within the range of the local region data 14, in its outward direction by a thickness corresponding to a tool diameter or a cutting amount, and sets the result as the local three-dimensional shape model 13 of a workpiece. FIG. 3B shows an example of the local region data 14 set by an operator. FIG. 3C depicts the local three-dimensional shape model 13 of a workpiece, obtained by the offset-deformation processing unit 4 by offsetting and deforming the shape of a part of the whole three-dimensional shape model 12 of a workpiece, which is included within the range of the local region data 14.

In the second or later machining simulation, inside the machining simulation device 1, each of the tool-movement-data generation unit 5, the local tool-movement-data output unit 6, the local cutting-deformation processing unit 8, the local cutting-shape display unit 10, and the display superimposing unit 11 operates. Of the whole tool movement data 16 outputted by the tool-movement-data generation unit 5 based on the NC program 18, only a part included within the range indicated by the local region data 14 is left by the local tool-movement-data output unit 6 and outputted to the local cutting-deformation processing unit 8 as the local tool movement data 17. The other part thereof, not included within the range indicated by the local region data 14 (data of the whole tool movement data 16 except the local tool movement data 17), is erased (Step S4). The local cutting-deformation processing unit 8 cuts and deforms the local three-dimensional shape model 13 of a workpiece based on the local tool movement data 17 (Step S5).

Figure 3D:
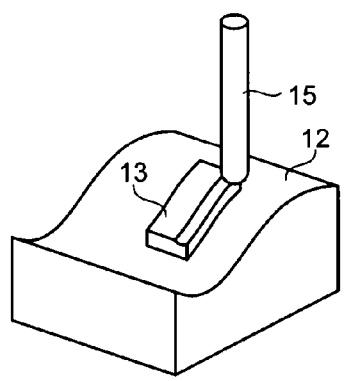
FIG. 3D is an illustration showing a further main processing content in a machining simulation.

The local three-dimensional shape model 13 of a workpiece after the cutting and deformation is graphically displayed on the display device 21 as a superimposed three-dimensional shape model superimposed on the display of the whole three-dimensional shape model 12 of a workpiece via the local cutting-shape display unit 10 and the display superimposing unit 11 (Step S6). FIG. 3D is an illustration showing a state where the local cutting-deformation processing unit 8 executes a local machining simulation on the local three-dimensional shape model 13 of a workpiece, and the local three-dimensional shape model 13 of a workpiece is superimposed on an original whole three-dimensional shape model 12 of an workpiece, and is graphically displayed along with the tool model 15.

After the local three-dimensional shape model 13 of a workpiece is obtained, when the superimposed three-dimensional shape model is visually checked, it is possible to identify the cause of a problem in respect of the machining and to establish measures thereagainst by visually checking the superimposed three-dimensional shape model, then an operator ends a machining simulation by an operation through the input device 22 (NO at Step S7). In this case, the operator can appropriately correct the NC program 18 based on a result of the examination executed by visually checking the superimposed three-dimensional shape model. When the cause of a problem with machining cannot be identified or a solution to the problem cannot be made, the second or later machining simulation is repeatedly executed by an operation through the input device 22 until it becomes possible to identify the cause of a problem in respect of the machining and to establish measures against the problem (YES at Step S7).

When the second or later machining simulation is executed, the simulation accuracy parameter 19 may be appropriately changed to check a more precise resultant shape, or the cutting condition parameter 20 may be appropriately changed to examine the effect of the change. It is also possible to change setting of a region of interest to another point as needed (the processing is advanced from YES at Step S7 to Step S2 as shown by a broken line in FIG. 2).

As described above, according to the present embodiment, a resultant shape of a point where particularly detailed checking is required can be obtained in a shorter time than in the case where a machining simulation is re-executed from the beginning of the machining. Therefore, the machining simulation can be repeated more efficiently. Accordingly, it is easier to identify the cause of a problem in respect of the machining and to establish measures against the problem on a stage before actually performing machining of a product. Consequently, an occurrence of a defective product can be suppressed when the machining is actually performed on a workpiece, thereby improving yields.

Further, as compared to a method in which data are saved in a state partway through the machining simulation, and from that point in time, the machining simulation is restarted, an extra storage area is not necessary, and therefore a more inexpensive machining simulation device can be provided.

Second Embodiment

Figure 4:
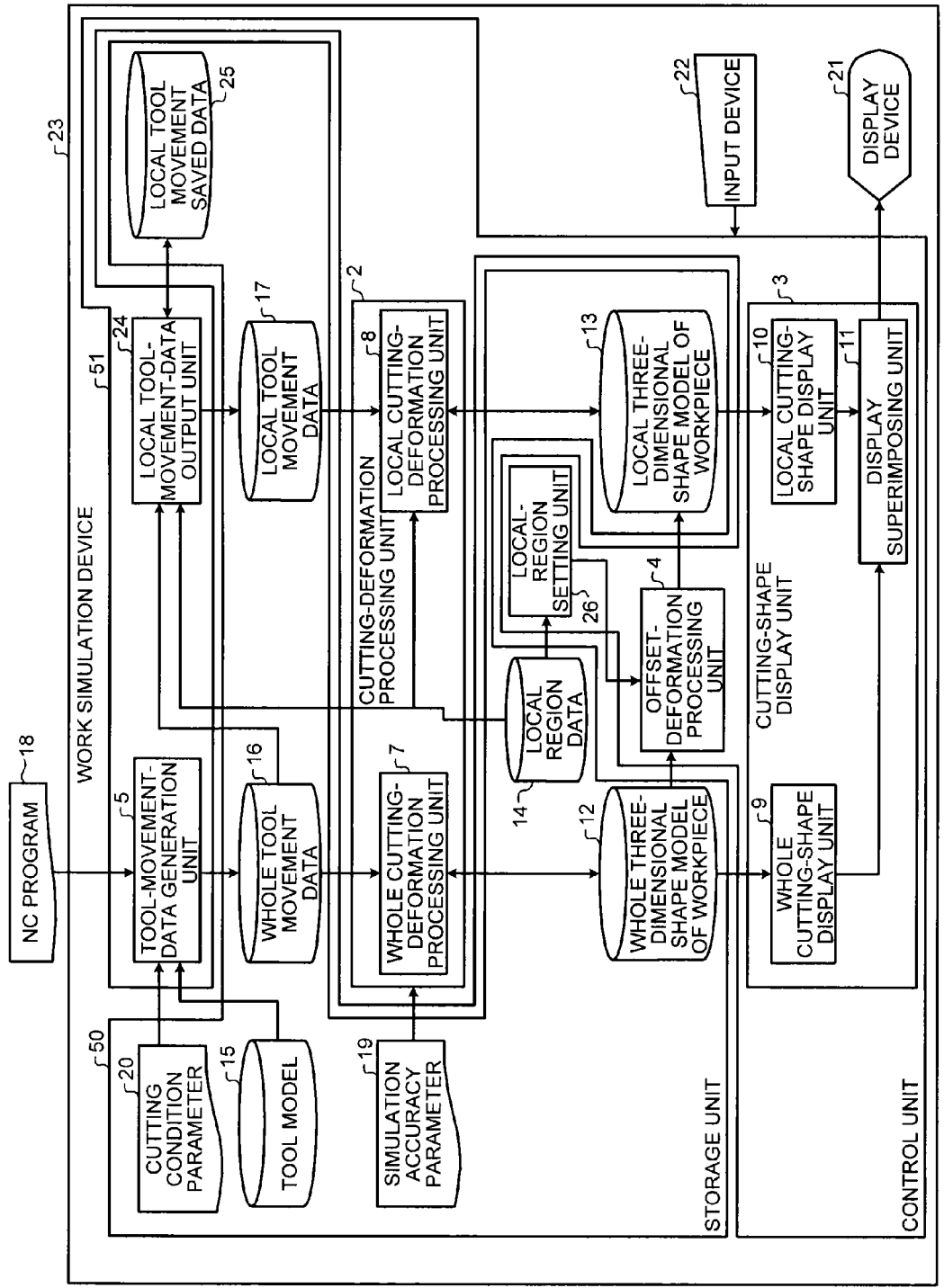
FIG. 4 is a diagram showing a configuration of a machining simulation device according to a second embodiment of the present invention.

FIG. 4 is a diagram showing a configuration of a machining simulation device according to a second embodiment of the present invention. In the present embodiment, in a machining simulation device 23, a local tool-movement-data output unit 24 operates differently from the local tool-movement-data output unit 6 in the first embodiment, and the machining simulation device 23 additionally includes a unit that stores therein local tool movement saved data 25. Other data and individual operations of processing units are the same as those in the first embodiment.

At the time of executing the first machining simulation, the local tool-movement-data output unit 24 stores, in the local tool movement saved data 25 in an accumulative manner, tool movement data of the whole tool movement data 16 in the case where a tool model passes through a region of the local region data 14 set in advance, based on the local region data 14. In the second or later machining simulation, the tool movement data stored in the local tool movement saved data 25 are outputted sequentially.

An operation flow of each unit in a series of repetitions of machining simulations is partially different from the operation flow of the first embodiment. At the time of executing the first machining simulation, the tool-movement-data generation unit 5 and the local tool-movement-data output unit 24 both operate to store tool movement data in the local tool movement saved data 25. At the time of executing the second or later machining simulation, the tool-movement-data generation unit 5 does not operate, and solely the tool movement data stored in the local tool movement saved data 25 are outputted to execute the machining simulation.

When a point that is likely to become problematic in respect of the machining is predicted for a reason of past similar machining cases and the like, the machining simulation device according to the second embodiment sets the local region data 14 in advance, whereby the setting is useful in repeatedly checking the problematic point. That is, in the second or later machining simulation, tool movement data related to the problematic point can be immediately obtained, and therefore the shape resulting from the machining simulation can be checked earlier.

As described above, according to the present embodiment, when a point that is likely to become problematic in respect of the machining is estimated based on past similar machining cases, a shape of the result of the machining simulation at a point of interest can be obtained earlier, and therefore it is possible to proceed with repetition of the machining simulation more efficiently.

REFERENCE SIGNS LIST 1, 23 machining simulation device
2 cutting-deformation processing unit
3 cutting-shape display unit
4 offset-deformation processing unit
5 tool-movement-data generation unit
6, 24 local tool-movement-data output unit
7 whole cutting-deformation processing unit
8 local cutting-deformation processing unit
9 whole cutting-shape display unit
10 local cutting-shape display unit
11 display superimposing unit
12 whole three-dimensional shape model of workpiece
13 local three-dimensional shape model of workpiece
14 local region data
15 tool model
16 whole tool movement data
17 local tool movement data
18 NC program
19 simulation accuracy parameter
20 cutting condition parameter
21 display device
22 input device
25 local tool movement saved data
26 local-region setting unit
50 storage unit
51 control unit

The invention claimed is:

1. A machining simulation device that simulates cutting work on a workpiece by cutting and deforming a three-dimensional shape model of the workpiece based on a tool model and movement path data representing a movement path of a tool, and displaying the cut and deformed three-dimensional shape model of the workpiece, the device comprising:
a holding unit that holds therein the three-dimensional shape model of the workpiece after the cutting work generated by simulating the cutting work from beginning to end or a midway point;
a unit that sets a local region for the three-dimensional shape model of the workpiece after the cutting work;
a unit that generates a local three-dimensional shape model of the workpiece obtained by increasing a thickness of a shape of a part of the three-dimensional shape model of the workpiece after the cutting work by a predetermined thickness in an outward direction, wherein the local region is set for the three-dimensional shape model of the workpiece after the cutting work;
a tool-movement-data generation unit that generates whole tool movement data based on the tool model and the movement path data of the tool;
a local tool-movement-data output unit that outputs local tool movement data that are tool movement data obtained when the tool passes through the local region from the whole tool movement data;
a local cutting-deformation processing unit that cuts and deforms the local three-dimensional shape model of the workpiece based on the local tool movement data; and
a unit that displays a superimposed three-dimensional shape model obtained by superimposing the local three-dimensional shape model of the workpiece, which has been cut and deformed by the local cutting-deformation processing unit, on the three-dimensional shape model of the workpiece obtained after the cutting work, which has been held in the holding unit.

2. The machining simulation device according to claim 1, wherein the local tool-movement-data output unit deletes data except the local tool movement data in the whole tool movement data.

3. The machining simulation device according to claim 1, further comprising a local tool-movement-data holding unit that holds therein the local tool movement data, wherein
the local cutting-deformation processing unit cuts and deforms the local three-dimensional shape model of the workpiece using the local tool movement data read from the local tool-movement-data holding unit.

4. A machining simulation method comprising:
a first step of simulating cutting work on a workpiece by cutting and deforming a three-dimensional shape model of the workpiece based on a tool model and movement path data representing a movement path of a tool, and displaying the cut and deformed three-dimensional shape model of the workpiece, thereby executing a first machining simulation on the workpiece from beginning to end or a midway point;
a second step of setting a local region for the three-dimensional shape model of the workpiece after the first step;
a third step of generating a local three-dimensional shape model of the workpiece obtained by increasing a thickness of a shape of a part of the three-dimensional shape model of the workpiece after the cutting work obtained at the first step by a predetermined thickness in an outward direction, wherein the local region is set for the three-dimensional shape model of the workpiece after the cutting work;
a fourth step of cutting and deforming the local three-dimensional shape model of the workpiece based on local tool movement data that is outputted when the tool passes through the local region from whole tool movement data generated based on the tool model and the movement path data of the tool;
a fifth step of displaying a superimposed three-dimensional shape model obtained by superimposing the local three-dimensional shape model of the workpiece, which has been deformed at the fourth step, on the three-dimensional shape model of the workpiece, which has been cut and deformed at the first step; and
a sixth step of changing accuracy of the machining simulation and a condition of the cutting work,
wherein the third step to the sixth step are repeated more than once.

5. A machining simulation device that simulates cutting work on a workpiece by cutting and deforming a three-dimensional shape model of the workpiece based on a tool model and movement path data representing a movement path of a tool, and displaying the cut and deformed three-dimensional shape model of the workpiece, the device comprising:
a storage that holds therein the three-dimensional shape model of the three-dimensional shape model of the workpiece after the cutting work generated by simulating the cutting work from beginning to end or a midway point; and a processor configured to:
- set a local region for the three-dimensional shape model of the workpiece after the cutting work,
- generate a local three-dimensional shape model of the workpiece obtained by increasing a thickness of a shape of a part of the three-dimensional shape model of the workpiece after the cutting work by a predetermined thickness in an outward direction, wherein the local region is set for the three-dimensional shape model of the workpiece after the cutting work,
- generate whole tool movement data based on the tool model and the movement path data of the tool,
- output local tool movement data that are tool movement data obtained when the tool passes through the local region from the whole tool movement data,
- cut and deform the local three-dimensional shape model of the workpiece based on the local tool movement data, and
- control a display to display a superimposed three-dimensional shape model obtained by superimposing the local three-dimensional shape model of the workpiece, which has been cut and deformed, on the three-dimensional shape model of the workpiece obtained after the cutting work, which has been held in the storage.

* * * * *